(12) United States Patent
Tomioka et al.

(10) Patent No.: US 8,199,503 B2
(45) Date of Patent: Jun. 12, 2012

(54) ELECTRONIC DEVICE

(75) Inventors: Kentaro Tomioka, Sayama (JP);
Takeshi Hongo, Sagamihara (JP)

(73) Assignee: Kabushiki Kaisha Toshiba, Tokyo (JP)

(*) Notice: Subject to any disclaimer, the term of this patent is extended or adjusted under 35 U.S.C. 154(b) by 135 days.

(21) Appl. No.: 12/845,609

(22) Filed: Jul. 28, 2010

(65) Prior Publication Data

US 2011/0075371 A1 Mar. 31, 2011

(30) Foreign Application Priority Data

Sep. 30, 2009 (JP) .................. 2009-228132

(51) Int. Cl.
*H05K 7/20* (2006.01)
*F28D 15/00* (2006.01)
(52) U.S. Cl. .................... 361/700; 165/104.33
(58) Field of Classification Search .............. 361/700
See application file for complete search history.

(56) References Cited

U.S. PATENT DOCUMENTS

| | | | | |
|---|---|---|---|---|
| 7,675,752 | B2 * | 3/2010 | Hongo | 361/700 |
| 7,710,725 | B2 * | 5/2010 | Takakusaki et al. | 361/700 |
| 7,885,067 | B2 | 2/2011 | Sakata | |
| 7,952,877 | B2 * | 5/2011 | Okutsu | 361/700 |
| 7,965,512 | B2 * | 6/2011 | Huang et al. | 361/700 |
| 2009/0103262 | A1 | 4/2009 | Hata | |
| 2009/0135563 | A1 | 5/2009 | Sakata | |
| 2009/0175003 | A1 * | 7/2009 | Ali et al. | 361/695 |

FOREIGN PATENT DOCUMENTS

| | | |
|---|---|---|
| JP | 2002-517894 | 6/2002 |
| JP | 2006-310740 | 11/2006 |
| JP | 2009-086704 | 4/2009 |
| JP | 2009-104241 | 5/2009 |
| JP | 2009-129378 | 6/2009 |
| JP | 2009-150561 | 7/2009 |
| JP | 2010-021379 | 1/2010 |
| WO | WO 99/47994 | 9/1999 |

OTHER PUBLICATIONS

Notice of Reasons for Rejection mailed by the Japan Patent Office on Oct. 5, 2010 in corresponding Japanese patent app. No. 2009-228132 in 10 pages.

* cited by examiner

*Primary Examiner* — Gregory Thompson
(74) *Attorney, Agent, or Firm* — Knobbe, Martens, Olson & Bear

(57) ABSTRACT

According to one embodiment, an electronic device includes a housing, a circuit board, a thermally radiative section, a first heat generator, a second heat generator, a first heat receiving block, a second heat receiving block, at least one heat pipe including a first end and a second end, a second heat pipe including a third end, a fourth end, and an intermediate portion, and a cutout section provided on the first heat receiving block. The second heat generator is mounted on the circuit board at a position farther from the thermally radiative section than the first heat generator is. The first heat receiving block is provided with a cutout section and is thermally connected to the first heat generator. The second heat receiving block is thermally connected to the second heat generator. The intermediate portion of the second heat pipe passes through the cutout section.

12 Claims, 7 Drawing Sheets

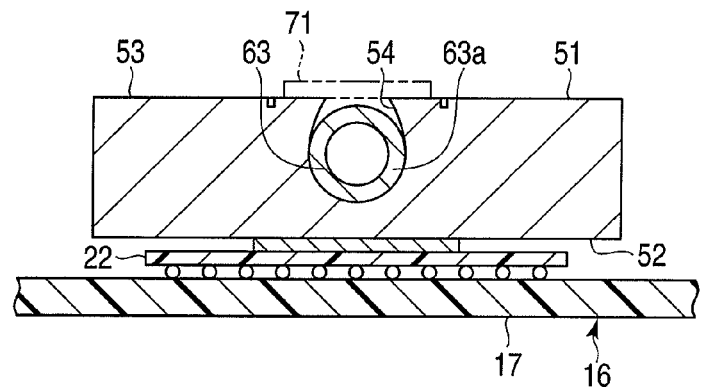
F I G. 8
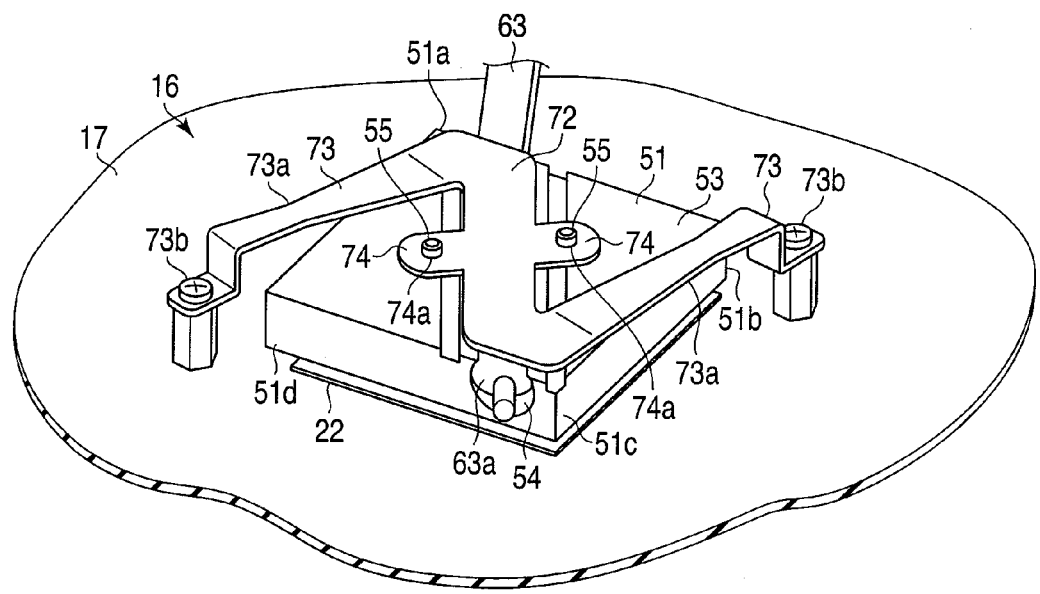
F I G. 9

ELECTRONIC DEVICE

CROSS-REFERENCE TO RELATED APPLICATIONS

This application is based upon and claims the benefit of priority from Japanese Patent Application No. 2009-228132, filed Sep. 30, 2009; the entire contents of which are incorporated herein by reference.

FIELD

Embodiments described herein relate generally to an electronic device, for example, having a thermally radiative structure.

BACKGROUND

On a circuit board of an electronic device, such as a video recorder and a personal computer, a heat generator, such as an LSI, is mounted. In order to cool such heat generator, a cooling system using a heat pipe and a heat sink, for example, are used.

In a heat sink disclosed in Jpn. Pat. Appln. KOKAI Publication No. 2009-150561, one-end portions of first heat pipes or one-end portions of second heat pipes are thermally connected to a plurality of heat generators. The other end portions of the heat pipes are thermally connected to the heat sink. A contact area of the first heat pipe with respect to the heat sink is different from that of the second heat pipe, thus the plurality of heat generators are efficiently cooled.

As a member for thermally connecting the heat pipe to the heat generator, a heat receiving block may be used. A heat receiving block has a heat receiving surface which contacts the heat generator and a fitting portion such as a hole in which an end of the heat pipe fits. The heat receiving block is thermally connected to the heat generator and the heat pipe.

By using a heat receiving block, it is possible to more efficiently cool the heat generator than when the heat pipe is thermally connected to the heat generator directly. However, a heat receiving block is a relatively large component among the components that are mounted on a circuit board. Therefore, the heat receiving block may restrict arrangement of the other components.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 8 is an exemplary longitudinal sectional view taken along line F8-F8 of FIG. 4;

FIG. 9 is an exemplary perspective view which shows a periphery of the second heat receiving block shown in FIG. 7;

DETAILED DESCRIPTION

Various embodiments will be described hereinafter with reference to the accompanying drawings.

In general, according to one embodiment, an electronic device comprises a housing, a circuit board, a thermally radiative section, a first heat generator, a second heat generator, a first heat receiving block, a second heat receiving block, at least one heat pipe including a first end and a second end, a second heat pipe including a third end, a fourth end, and an intermediate portion, and a cutout section provided on the first heat receiving block.

The circuit board and the thermally radiative section are placed inside the housing. The first heat generator is mounted on the circuit board. The second heat generator is mounted on the circuit board at a position farther from the thermally radiative section than the first heat generator is. The first heat receiving block is provided with a cutout section and is thermally connected to the first heat generator to be opposed to the first heat generator. The second heat receiving block is opposed to the second heat generator and thermally connected to the second heat generator. The first end is thermally connected to the first heat receiving block. The second end is thermally connected to the thermally radiative section. The third end is thermally connected to the second heat receiving block. The fourth end is thermally connected to the thermally radiative section. The intermediate portion is positioned between the third end and the fourth end, and passes through a region opposed to the first heat generator. The intermediate portion of the second heat pipe passes through the cutout section with a gap being formed between the intermediate portion and an edge part of the first heat receiving block which defines the cutout section.

A first embodiment will now be described with reference to FIGS. 1 to 9.

Figure 1:
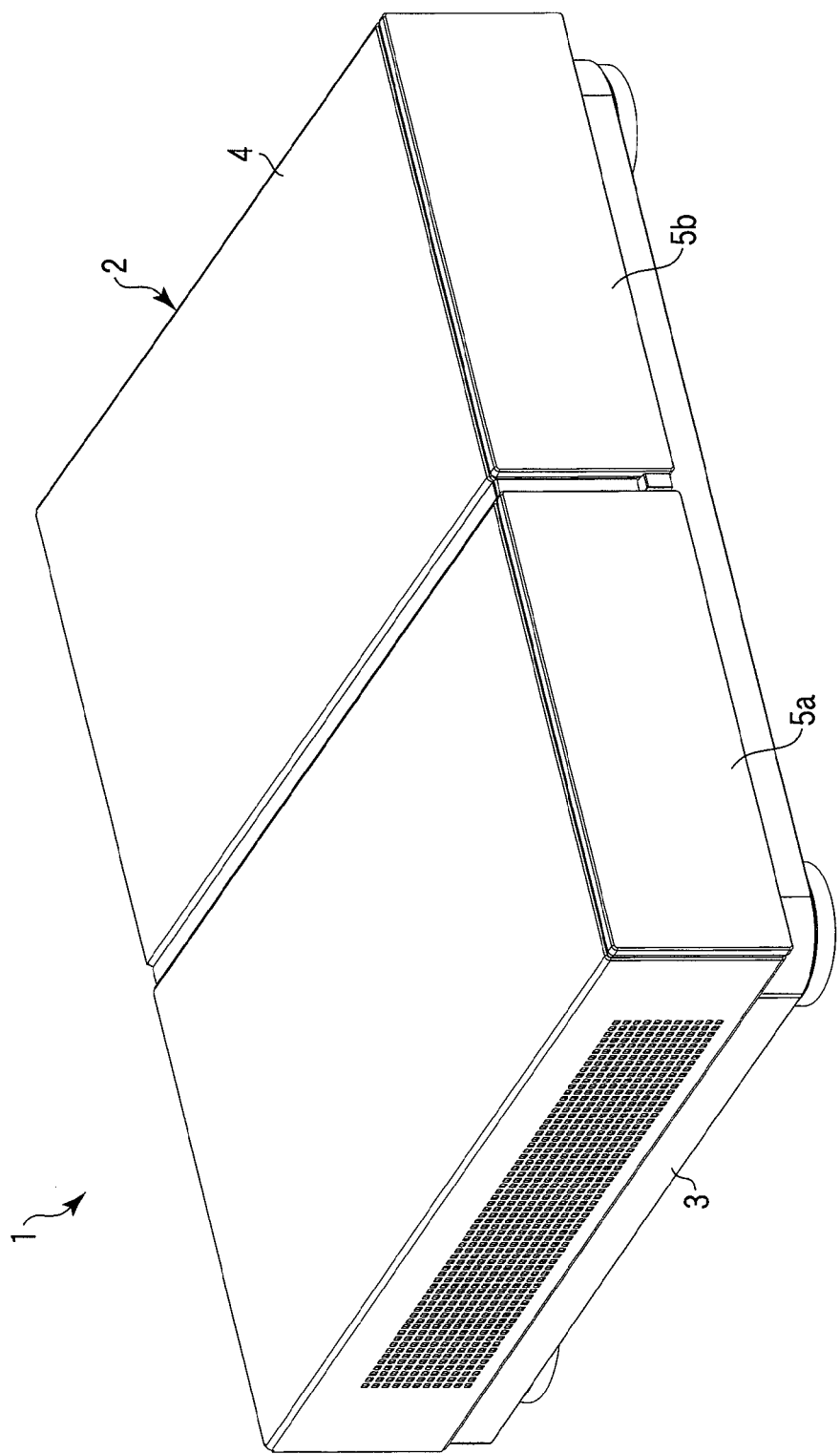
FIG. 1 is an exemplary perspective view of a television connection device according to a first embodiment.

FIG. 1 shows a television connection device 1 which is an example of an electronic device. The television connection device 1 is connected to a liquid crystal television in using it. The television connection device 1 has a function of receiving various television programs, for example, and a function of simultaneously recording a plurality of television programs or recording long programs.

The television connection device 1 comprises a flat box-shaped device body 2. The device body 2 includes a metallic housing 3, a dress cover 4, and right and left front doors 5b and 5a. The dress cover 4 covers the housing 3. The right and left front doors 5b and 5a cover the front of the dress cover 4. Further, in the description of the present embodiment, the direction in which the front doors 5a and 5b are provided will be referred to as the front of the television connection device 1 and the opposite direction will be referred to as the back of the television connection device 1.

Figure 2:
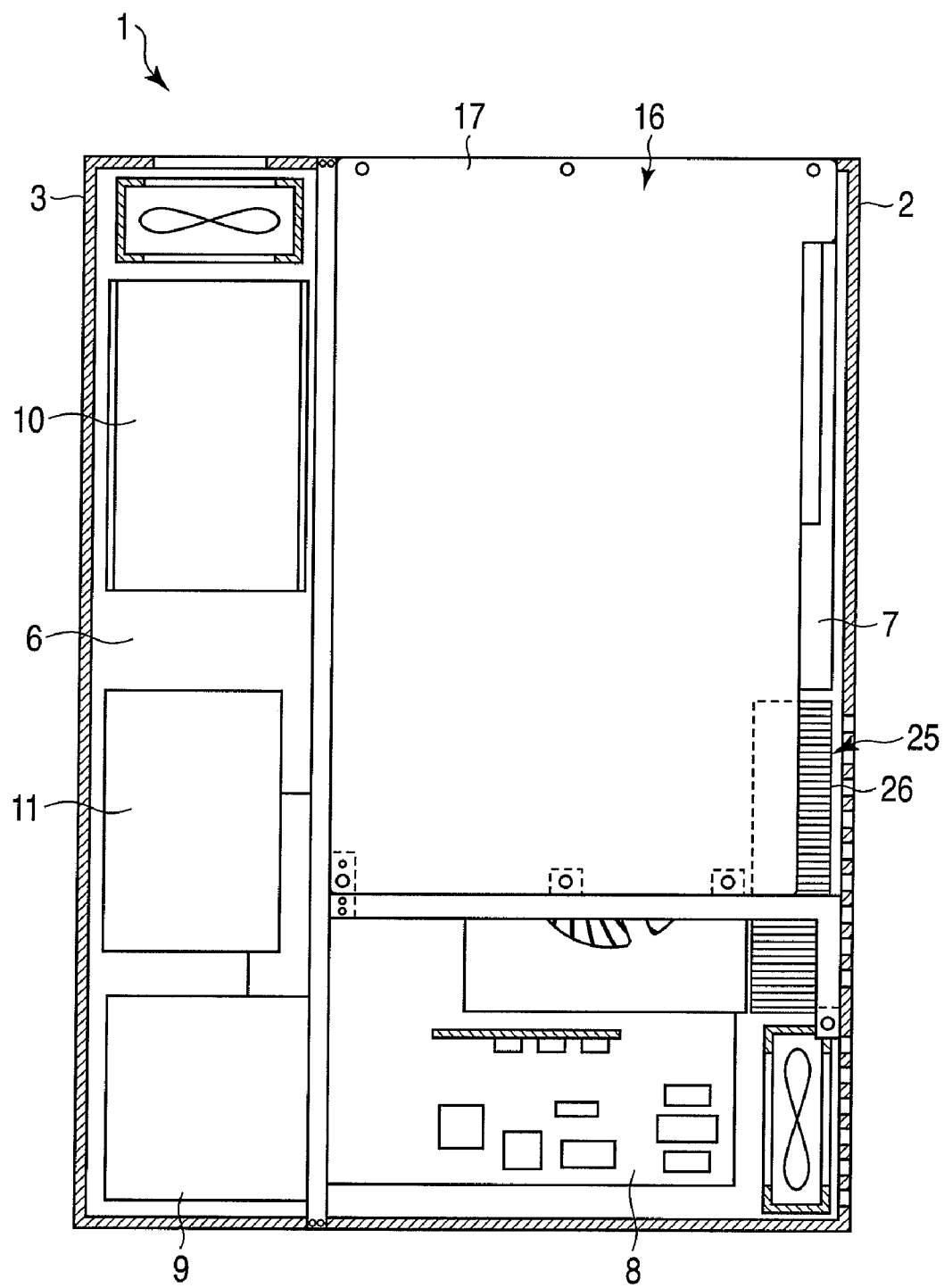
FIG. 2 is an exemplary horizontal sectional view which shows an internal structure of the television connection device shown in FIG. 1.
Figure 3:
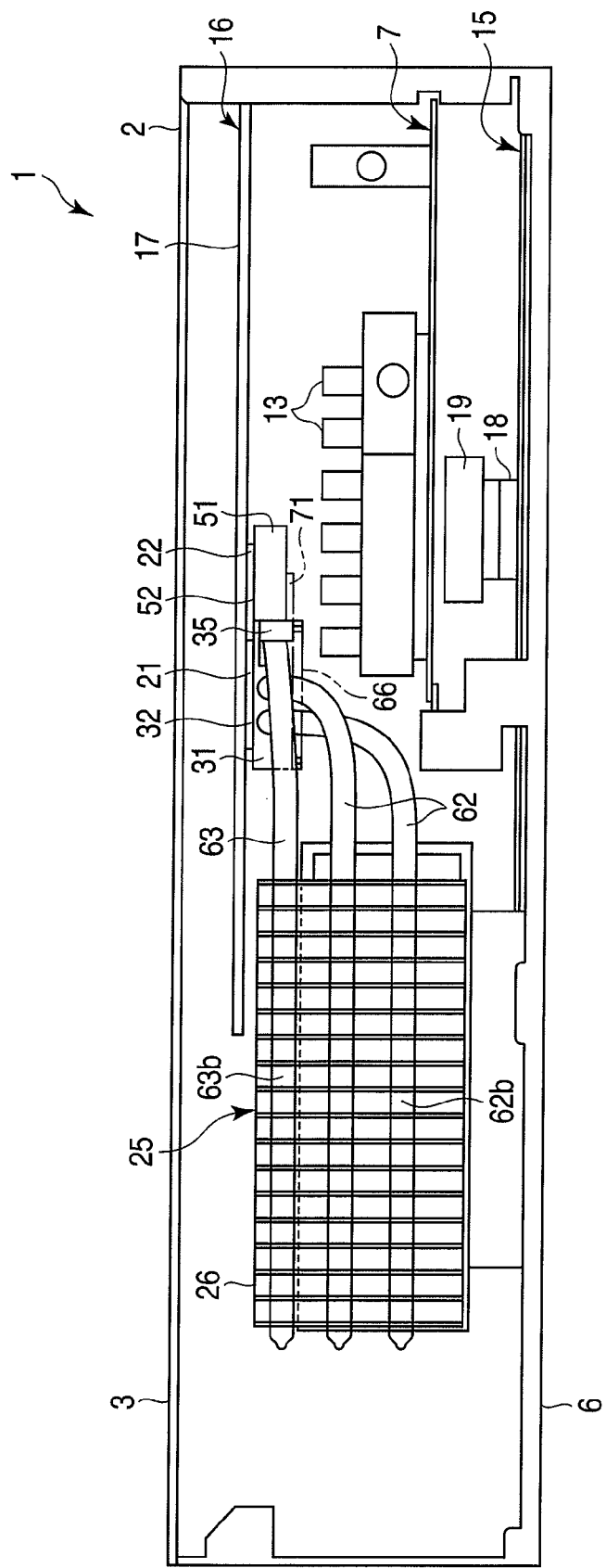
FIG. 3 is an exemplary back view which shows the interior of the television connection device shown in FIG. 1 from the back.

As shown in FIGS. 2 and 3, the housing 3 serves as a framework of the device body 2, and has a flat base plate 6. A tuner board 7, a power source module 8, a card connection unit 9, a first information storage module 10, and a second information storage module 11 are arranged on the base plate 6 of the housing 3.

The tuner board 7 and the power source module 8 are arranged on the back part of the device body 2. The card connection unit 9, the first information storage module 10, and the second information storage module 11 are arranged on the front part of the device body 2, and aligned in a width direction of the device body 2.

On the tuner board 7, a plurality of tuners 13 for receiving a television program are mounted. In the card connection unit 9, a plurality of B-CAS cards for receiving digital terrestrial and BS digital broadcasts or the like are inserted.

The first and second information storage modules 10 and 11 are storage devices, such as hard disc drives. The first and second information storage devices 10 and 11 are for recording television programs and rapidly searching the recorded television programs and reproducing them.

As shown in FIG. 3, an image processing board 15 is provided below the tuner board 7. A main module 16 is provided above the tuner board 7. The tuner board 7, the image processing board 15, and the main module 16 are contained within the housing 3 in parallel with each other.

Figure 4:
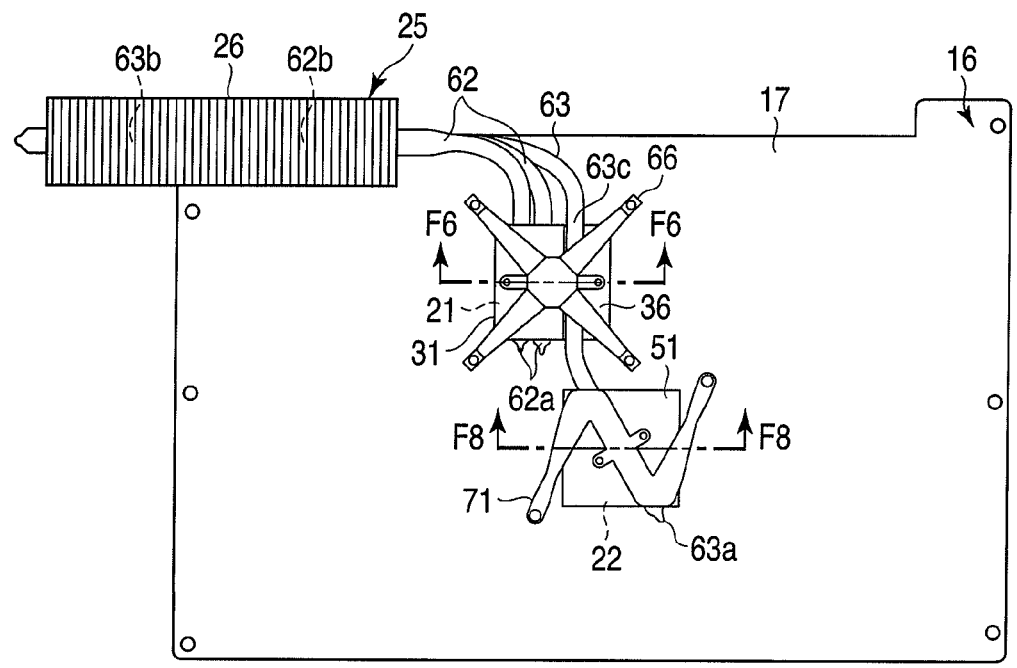
FIG. 4 is an exemplary plan view which shows a main board of the television connection device shown in FIG. 1.

An image processing chip 18, for example, is mounted on the image processing board 15. A heat sink 19 for effecting thermal radiation is arranged on the image processing chip 18. As shown in FIG. 4, the main module 16 has a main board 17, a cell processor 21, an I/O controller 22, and a cooling device 25. The main board 17 is an example of a circuit board. The cell processor 21 is an example of a first heat generator. The I/O controller 22 is an example of a second heat generator. Further, the main module 16 has a plurality of components that are not shown, such as a capacitor and a memory.

The cooling device 25 contains a thermally radiative section 26 which is disposed at an end of the main board 17. An example of the thermally radiative section 26 is a radiation fin having a plurality of fin elements.

Each of the cell processor 21 and the I/O controller 22 is a ball grid array (BGA) which generates heat when used. The cell processor 21 and the I/O controller 22 are soldered on a pad (not shown) provided on the main board 17 to be mounted on the main board 17.

The first and the second heat generators are not limited to the cell processor 21 and the I/O controller 22. The first and the second heat generators may be other electronic components which generate heat when used including a CPU, a graphic chip, North Bridge (trademark), or a memory. The first and the second heat generators are not limited to the above examples, and may be various components that generate heat.

As shown in FIG. 4, the I/O controller 22 is mounted on the main board 17 at a position farther from the thermally radiative section 26 than the cell processor 21 is. The cell processor 21 is positioned on a path which connects the I/O controller 22 and the thermally radiative section 26, for example.

For example, power consumption of the cell processor 21 is greater than that of the I/O controller 22. That is, the cell processor 21 generates more heat than the I/O controller 22, and the cell processor 21 tends to have a high temperature as compared to the I/O controller 22.

For example, an upper limit of a normalized temperature of the cell processor 21 is higher than an upper limit of a normalized temperature of the I/O controller 22. The "normalized temperature" is the so-called spec temperature, and refers to a temperature range in which an operation of the components is secured.

Figure 5:
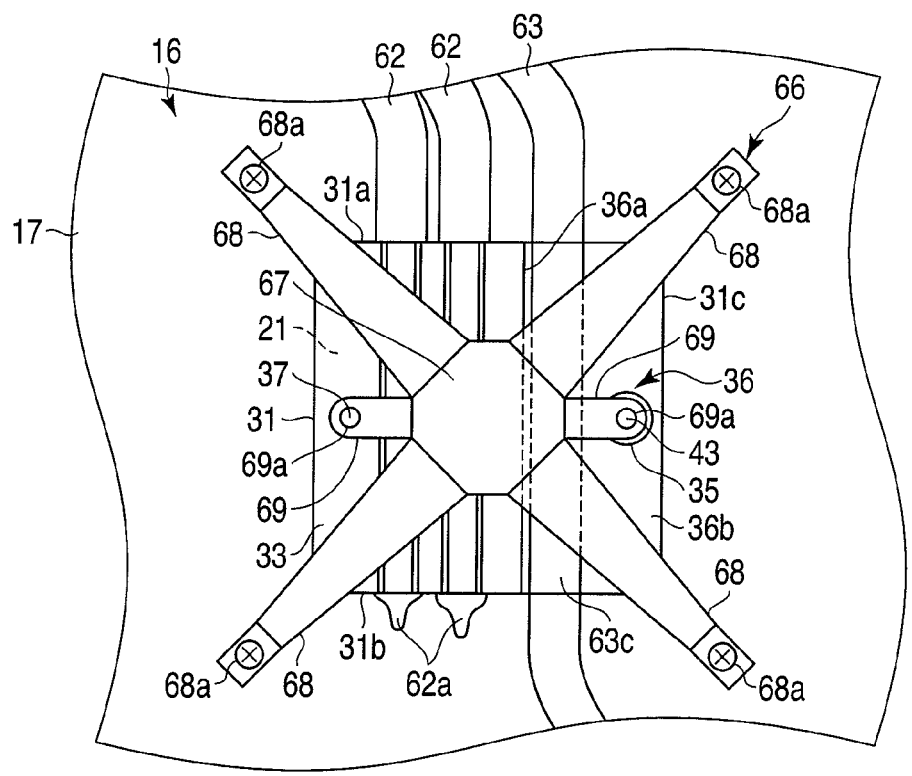
FIG. 5 is an exemplary plan view which shows a periphery of a first heat receiving block to be mounted on the main board shown in FIG. 4.
Figure 6:
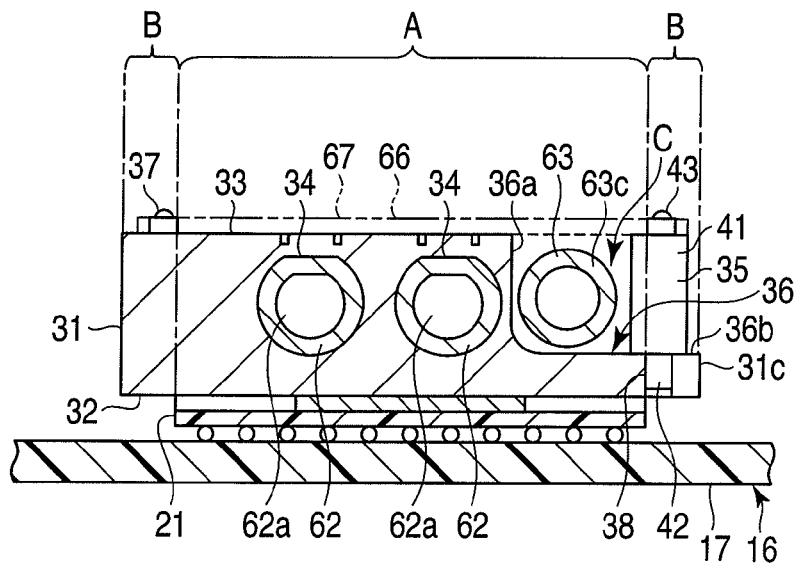
FIG. 6 is an exemplary longitudinal sectional view taken along line F6-F6 of FIG. 4.

As shown in FIGS. 5 and 6, a first heat receiving block 31 is arranged on the cell processor 21. The first heat receiving block 31 is a metallic block. The first heat receiving block 31 has a flat heat receiving surface 32, a to-be-pressed surface 33, a first side surface 31a, a second side surface 31b, and a third side surface 31c.

The heat receiving surface 32 is opposed to the cell processor 21. The to-be-pressed surface 33 is on the opposite side of the heat receiving surface 32. The second side surface 31b is on the opposite side of the first side surface 31a. The third side surface 31c is orthogonal to the first and second side surfaces 31a and 31b.

As shown in FIG. 6, the first heat receiving block 31 contains opposed area A and peripheral areas B. The opposed area A is an area which is opposed to the cell processor 21. The peripheral areas B are outside the opposed area A and surround the periphery of the opposed area A. The first heat receiving block 31 is thermally connected to the cell processor 21 in the opposed area A of the heat receiving surface 32.

A cutout section 36 and two connection holes 34 are provided on the first heat receiving block 31. The first heat receiving block 31 has a stud 35 and a positioning pin 37. The stud 35 is an example of a restriction member. Each of the two connection holes 34 is arranged extending from the first side surface 31a to the second side surface 32a of the first heat receiving block 31. The positioning pin 37 is projected from the peripheral area B of the to-be-pressed surface 33.

The cutout section 36 is provided at a corner where the third side surface 31c of the first heat receiving block 31 and the to-be-pressed surface 33 adjoin each other. The cutout section 36 is defined by an internal surface 36a of the first heat receiving block 31 and a bottom surface 36b. The internal surface 36a continues from the to-be-pressed surface 33. The bottom surface 36b continues from the third side surface 31c. The internal surface 36a and the bottom surface 36b are examples of an edge part of the first heat receiving block which defines the cutout section. In the peripheral area B of the bottom surface 36b, a press-fit hole 38, which extends from the bottom surface 36b to the heat receiving surface 32, is arranged.

The stud 35 is arranged on the bottom surface 36b. The stud 35 has a columnar spacer portion 41, a press-fit pin 42, and a positioning pin 43. The press-fit pin 42 is arranged on one end of the spacer portion 41. The positioning pin 43 is arranged on the other end of the spacer portion 41.

The press-fit pin 42 is larger than the press-fit hole 38 in diameter and shorter than the press-fit hole 38 in length. The stud 35 is fixed in the peripheral area B of the first heat receiving block 31 as the press-fit pin 42 is pressed into the press-fit hole 38. The positioning pin 43 has a form which is similar to the form of the positioning pin 37 of the first heat receiving block 31, and is positioned in the peripheral area B.

Figure 7:
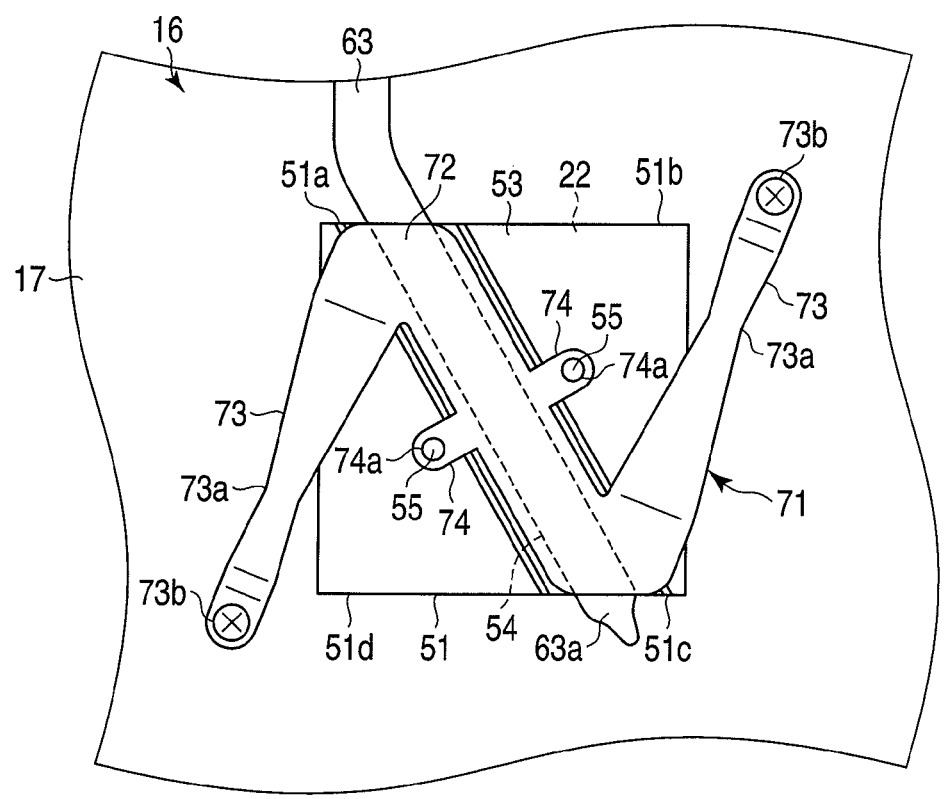
FIG. 7 is an exemplary plan view which shows a periphery of a second heat receiving block to be mounted on the main board shown in FIG. 4.

As shown in FIGS. 7 to 9, a second heat receiving block 51 is arranged on the I/O controller 22. The second heat receiving block 51 is a metallic block. The second heat receiving block 51 has a flat heat receiving surface 52, a to-be-pressed surface 53, and a first corner 51a, a second corner 51b, a third corner 51c, and a fourth corner 51d. The heat receiving surface 52 is opposed to the I/O controller 22. The to-be-pressed surface 53 is on the opposite side of the heat receiving surface 52. The second heat receiving block 51 is thermally connected to the I/O controller 22 on the heat receiving surface 52.

A fitting portion 54, which extends from the first corner 51a to the third corner 51c of the second heat receiving block 51, is arranged. The fitting portion 54 is a notch which opens in the to-be-pressed surface 53 of the second heat receiving block 51.

A pair of positioning pins 55 is arranged on the to-be-pressed surface 53 of the second heat receiving block 51. The positioning pins 55 are arranged symmetrically with the fitting portion 54 located therebetween.

As shown in FIG. 4, the cooling device 25 has the thermally radiative section 26, two first heat pipes 62, and a second heat pipe 63. The first and second heat pipes 62 and 63 are formed by filling a working fluid, such as water, into a hollow rod-like main body made of copper, etc.

The two first heat pipes 62 have a first end 62a and a second end 62b. The first end 62a in each of the two first heat pipes is thermally connected to the first heat receiving block 31. The second end 62b is thermally connected to the thermally radiative section 26.

The first end 62a is thermally connected to the first heat receiving block 31 as it is inserted into the connection hole 34 of the first heat receiving block 31 and caulked. The second end 62b is thermally connected to the thermally radiative section 26 as it penetrates through the fin elements of the thermally radiative section 26.

The second heat pipe 63 has a third end 63a, a fourth end 63b, and an intermediate portion 63c. The third end 63a is thermally connected to the second heat receiving block 51. The fourth end 63b is thermally connected to the thermally radiative section 26. The intermediate portion 63c is positioned between the third end 63a and the fourth end 63b.

The third end 63a is thermally connected to the second heat receiving block 51 as it is fitted into the fitting portion 54 of the second heat receiving block 51 and caulked. The fourth end 63b is thermally connected to the thermally radiative section 26 as it penetrates through the fin elements of the thermally radiative section 26. As shown in FIG. 3, the fourth end 63b is connected to the thermally radiative section 26 at a position closer to the main board 17 than the second end 62b of the first heat pipe 62 is.

As shown in FIG. 6, the intermediate portion 63c passes through the cutout section 36 of the first heat receiving block 31 so that it passes through the opposed area A above the cell processor 21. More specifically, the intermediate portion 63c passes through passage area C which is between the internal surface 36a of the cutout section 36 and the spacer portion 41 of the stud 35. That is, the position at which the intermediate portion 63c passes through is restricted by the stud 35.

The intermediate portion 63c passes through the passage area C to form a gap between the second heat pipe 63 and the internal surface 36a which defines the cutout section 36, and between the second heat pipe 63 and the stud 35. Accordingly, the second heat pipe 63 is thermally separated from the first heat receiving block 31.

As shown in FIGS. 4 to 6, a first pressure member 66 is provided on the first heat receiving block 31. The first pressure member 66 is an X-shaped leaf spring. The first pressure member 66 has a main body section 67, four legs 68, and a pair of positioning sections 69. The main body section 67 is formed to be plate-like, for example, and opposed to the to-be-pressed surface 33 of the first heat receiving block 31.

The legs 68 extend externally from the periphery of the main body section 67 and are bent toward the main board 17. Distal end portions of the legs 68 are fixed to the main board 17 by fixing units 68a which are formed by combining screws and studs. The main body section 67 and the legs 68 in cooperation form a leaf spring structure. By this structure, the first pressure member 66 presses the first heat receiving block 31 toward the cell processor 21.

The pair of positioning sections 69 extend laterally relative to the main body section 67. On the positioning sections 69, through-hole section 69a are provided. As the positioning pin 37 of the first heat receiving block 31 and the positioning pin 43 of the stud 35 fit into the through-hole sections 69a, the first pressure member is positioned.

The first pressure member 66 is not limited to the above structure, and may be any type of member as long as it can press the first heat receiving block 31 toward the cell processor 21.

As shown in FIGS. 7 to 9, a second pressure member 71 is arranged on the second heat receiving block 51. The second pressure member 71 is an N-shaped leaf spring. The second pressure member 71 has a main body section 72, two legs 73, and a pair of positioning sections 74. The main body section 72 is formed to have a rectangular plate-like shape, for example, and opposed to the to-be-pressed surface 53 of the second heat receiving block 51.

The legs 73 are turned from both ends of the main body section 72, and bent toward the main board 17. Each of the legs 73 has a constricted portion 73a in which the width is narrowed. Distal end portions of the legs 73 are fixed to the main board 17 by fixing units 73b which are formed by combining screws and studs.

The main body section 72 contacts the to-be-pressed surface 53 so as to cover the fitting portion 54 of the second heat receiving block 51. The main body section 72 and the legs 73 in cooperation form a leaf spring structure. By this structure, the second pressure member 71 presses the second heat receiving block 51 toward the I/O controller 22.

The pair of positioning sections 74 extend laterally relative to the main body section 72. On the positioning sections 74, through-hole sections 74a are provided. As the positioning pins 55 of the second heat receiving block 51 fit into the through-hole sections 74a, the second pressure member is positioned.

The second pressure member 71 is not limited to the above structure, and may be any type of member as long as it can press the second heat receiving block 51 toward the I/O controller 22.

When the television connection device 1 of the above structure is used, the cell processor 21 and the I/O controller 22 generate heat. The heat emitted from the cell processor 21 is received by the first ends 62a of the first heat pipes 62 via the first heat receiving block 31. The heat received by the first ends 62a is conveyed to the thermally radiative section 26 by the first heat pipes 62.

On the other hand, heat emitted from the I/O controller 22 is received by the third end 63a of the second heat pipe 63 via the second heat receiving block 51. The heat received by the third end 63a is conveyed to the thermally radiative section 26 by the second heat pipe 63.

The intermediate portion 63c of the second heat pipe 63 passes through the cutout section 36 of the first heat receiving block 31. Since a gap is formed between the intermediate portion 63c and the first heat receiving block 31, the second heat pipe 63 receives heat only from the second heat receiving block 31.

Next, advantages of the television connection device of the above structure will be described.

The first heat receiving block 31 is provided with the cutout section 36 for passing through the intermediate portion 63c of the second heat pipe 63. By such a structure, the second heat pipe 63 does not need to make a detour around the first heat receiving block 31, and flexibility in the arrangement of components is increased.

More specifically, for example, when the second heat pipe 63 is arranged to detour around the first heat receiving block 31, the arrangement of other components, such as a capacitor on the periphery of the first heat receiving block 31, may be restricted. However, by arranging the cutout section 36 in the first heat receiving block 31 as in the present embodiment, the second heat pipe 63 does not need to make a detour around the first heat receiving block 31. Accordingly, restriction on the arrangement of other components by the first heat receiving block 31 is prevented.

The intermediate portion 63c of the second heat pipe 63 passes through the cutout section 36 with a gap formed between the second heat pipe 63 and internal surface 36a which defines the cutout section 36. By this structure, the cutout section 36 can absorb dimensional tolerance and make the intermediate portion 63c of the second heat pipe 63 pass therethrough.

Since the I/O controller 22 generates less heat than the cell processor 21, it is sufficient to connect only one heat pipe, namely, the second heat pipe 63, to the second heat receiving block 51 which thermally contacts the I/O controller 22. Thus, the size of the cutout section 36 can be small, and providing the cutout section 36 on the first heat receiving block 31 becomes easy.

The first pressure member 66 presses the first heat receiving block 31 on the cell processor 21. The second pressure member 71 presses the second heat receiving block 51 on the I/O controller 22. Thus, the first and second heat receiving blocks 31 and 51 can receive heat efficiently from the cell processor 21 and the I/O controller 22.

The stud 35 restricts the position where the intermediate portion 63c of the second heat pipe 63 passes through the cutout section 36. By such restriction, the second heat pipe 63 is prevented from moving out of the cutout section 36 and contacting the other components.

The press-fit pin 42 of the stud 35 is fitted in the press-fit hole 38 provided in the peripheral area B of the first heat receiving block 31. This structure prevents reduction in heat receiving efficiency of the first heat receiving block 31 although the first heat receiving block 31 has the stud 35 and the press-fit hole 38.

The first pressure member 66 has the through-hole sections 69a which fit with the positioning pin 37 of the first heat receiving block 31 and the positioning pin 43 of the stud 35. The second pressure member 71 has the through-hole sections 74a which fit with the positioning pins 55 of the second heat receiving block 51. By such a structure, positioning the first and second pressure members 66 and 71 becomes easy.

The fitting portion 54 of the second heat receiving block 51 is provided from the first corner 51a to the third corner 51c. By this structure, the contact area of the second heat receiving block 51 and the second heat pipe 63 can be increased.

The fourth end 63b of the second heat pipe 63 is connected to the thermally radiative section 26 at a position closer to the main board 17 than the second end 62b of the first heat pipe 62 is. Thus, the second heat pipe 63 can be shortened.

Since the second pressure member 71 of the above structure is N-shaped, a path from one fixing unit 73b to the other fixing unit 73b can be lengthened. Thus, the second pressure member 71 can press the second heat receiving block 51 with a sufficient load.

Each of the legs 73 of the second pressure member 71 is provided with the constricted portion 73a in which the width is narrowed. By this structure, balance of the load applied to the second pressure member 71 can be adjusted, and buckling due to stress concentration is prevented.

Next, other embodiments will now be described with reference to FIGS. 10 and 11. For the constituent features having the same function as the constituent features of the television connection device 1 of the first embodiment, same reference numerals are added and explanations thereof are omitted.

Figure 10:
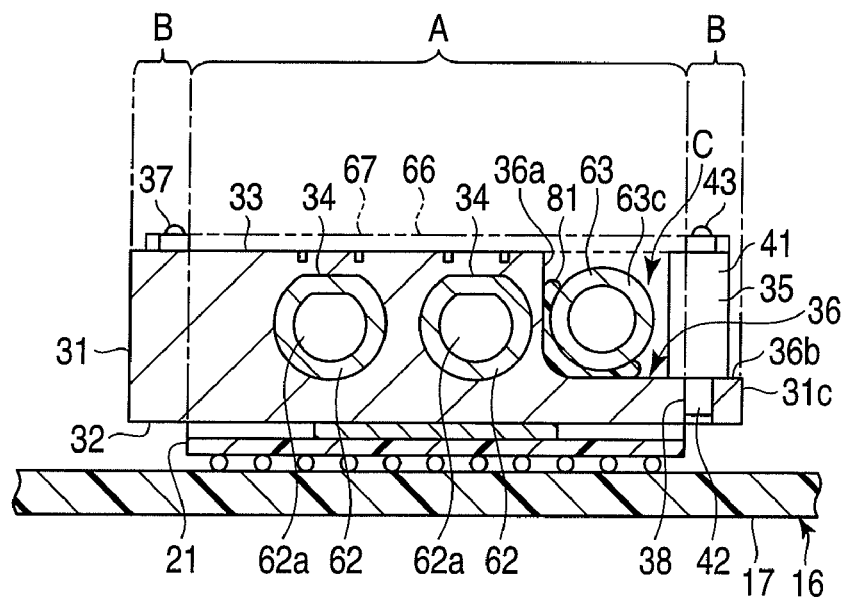
FIG. 10 is an exemplary longitudinal sectional view which shows a periphery of a first heat receiving block according to a second embodiment.
Figure 11:
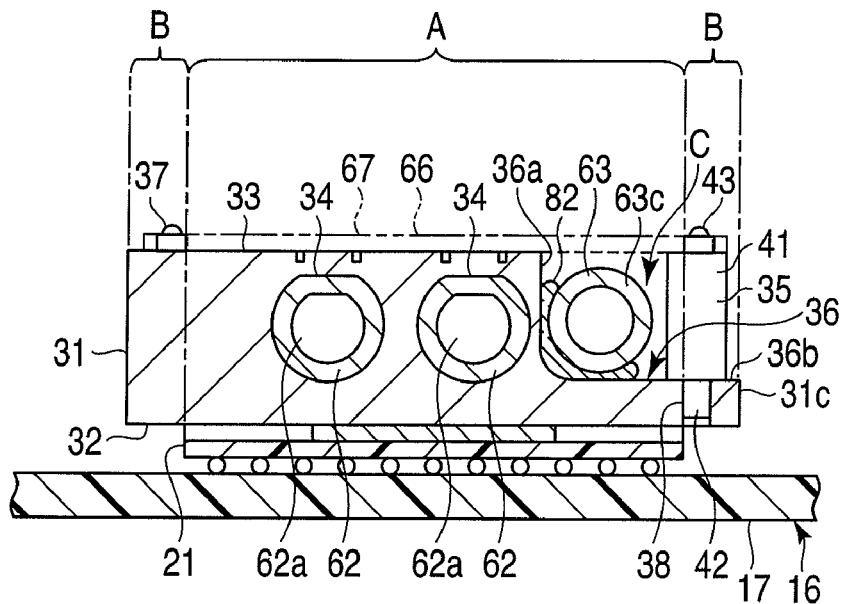
FIG. 11 is an exemplary longitudinal sectional view which shows a periphery of a first heat receiving block according to a third embodiment.

FIG. 10 shows a first heat receiving block 31 of a second embodiment. A television connection device 1 of the second embodiment is different from the television connection device 1 of the first embodiment in that a heat connection member 81 is provided.

The first heat receiving block 31 has a sheet-like heat connection member 81 in a gap between an internal surface 36a which defines a cutout section 36 and a second heat pipe 63. The heat connection member 81 thermally connects the first heat receiving block 31 and the second heat pipe 63.

The heat connection member 81 is mainly made of a synthetic resin having thermal conductivity, for example, and has great flexibility to be adaptable to the form of a component. The heat connection member 81 is not limited to above, and may be any type of member as long as it has thermal conductivity.

When the television connection device 1 of the above structure is used, a part of the heat emitted from a cell processor 21 is received by an intermediate portion 63c of the second heat pipe 63 via the first heat receiving block 31 and the heat connection member 81. The heat received by the intermediate portion 63c is conveyed to a thermally radiative section 26 by the second heat pipe 63.

The television connection device 1 of the above structure can realize a high cooling capability. That is, by providing the heat connection member 81 between the intermediate portion 63c of the second heat pipe 63 and the cutout section 36 of the first heat receiving block 31, the heat of the cell processor 21 can be conveyed by a first heat pipe 62 and the second heat pipe 63. Accordingly, cooling of the cell processor 21 can be further accelerated. Due to the above structure, cooling of the cell processor 21 can be further accelerated as compared to the first embodiment.

Since the heat connection member 81 has flexibility, a difference in a gap between the second heat pipe 63 and the first heat receiving block 31 which is caused by dimensional tolerance can be absorbed. By this structure, thermal connection between the second heat pipe 63 and the first heat receiving block 31 can be performed more firmly.

Next, a third embodiment will now be described with reference to FIG. 11. A television connection device 1 of the third embodiment is different from the television connection device 1 of the first embodiment in that a thermal insulation member 82 is provided.

A first heat receiving block 31 has a sheet-like thermal insulation member 82 in a gap between an internal surface 36a which defines a cutout section 36 and a second heat pipe 63. The thermal insulation member 82 thermally insulates the first heat receiving block 31 and the second heat pipe 63 from each other.

The thermal insulation member 82 is mainly made of a synthetic resin having heat insulating properties, for example, and has great flexibility to be adaptable to the form of a component. The thermal insulation member 82 is not limited to above, and may be any type of member as long as it has heat insulating properties.

By the television connection device 1 of the above structure, the second heat pipe 63 and the first heat receiving block 31 are prevented from contacting each other by dimensional tolerance or external force. Thus, the second heat pipe 63 and the first heat receiving block 31 are prevented from thermally connecting to each other. That is, if the second heat pipe 63 and the first heat receiving block 31 need to be thermally insulated from each other, the second heat pipe 63 can be securely insulated from the first heat receiving block 31.

Since the thermal insulation member 82 has flexibility, a difference in a gap between the second heat pipe 63 and the first heat receiving block 31 which is caused by dimensional tolerance can be absorbed. By this structure, the thermal insulation member 82 can more securely provide heat insulation between the second heat pipe 63 and the first heat receiving block 31.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The various modules of the systems described herein can be implemented as software applications, hardware and/or software modules, or components on one or more computers, such as servers. While the various modules are illustrated separately, they may share some or all of the same underlying logic or code. The accompanying claims and their equivalents are intended to cover such forms or modifications as would fall within the scope and spirit of the inventions.

What is claimed is:

1. An electronic device comprising:
   a housing;
   a circuit board housed in the housing;
   a thermally radiative section provided in the housing;
   a first heat generator mounted on the circuit board;
   a second heat generator mounted on the circuit board at a position farther from the thermally radiative section than the first heat generator is;
   a first heat receiving block provided with a cutout section and thermally connected to the first heat generator;
   a first heat pipe comprising a first end thermally connected to the first heat receiving block, and a second end thermally connected to the thermally radiative section;
   a second heat pipe comprising a third end thermally connected to the second heat generator, a fourth end thermally connected to the thermally radiative section, and an intermediate portion being located between the third end and the fourth end, and passing through the cutout section such that the intermediate portion is spaced apart from the first heat receiving block; and
   a restriction member provided in the first heat receiving block and configured to restrict a position of the intermediate portion in the cutout section.

2. An electronic device comprising:
   a housing;
   a circuit board housed in the housing;
   a thermally radiative section provided in the housing;
   a first heat generator mounted on the circuit board;
   a second heat generator mounted on the circuit board at a position farther from the thermally radiative section than the first heat generator is;
   a heat receiving block provided with a cutout section and thermally connected to the first heat generator;
   a first heat pipe comprising a first portion thermally connected to the heat receiving block, and a second portion connected to the thermally radiative section;
   a second heat pipe comprising a third portion thermally connected to the second heat generator, and a fourth portion connected to the thermally radiative section, a portion located between the third portion and the fourth portion being housed in the cutout section; and
   a member configured to position the second heat pipe in the cutout section.

3. The electronic device of claim 2, wherein
   the heat receiving block comprises a surface, and
   the member projects from the surface and is a positioning portion located outside the area facing the first heat generator.

4. The electronic device of claim 2, wherein
   the heat receiving block comprises a first surface opposed to the first heat generator, a second surface on the opposite side of the first surface, and a side surface crossing the first surface, and
   the cutout section comprises an internal surface continuous from the second surface, and a bottom surface continuous from the side surface.

5. The electronic device of claim 2, wherein the first heat generator is configured to generate more heat than the second heat generator.

6. The electronic device of claim 5, further comprising a leaf spring first pressure member configured to press the heat receiving block toward the first heat generator.

7. The electronic device of claim 6, further comprising:
   another receiving block interposed between the third portion of the second heat pipe and the second heat generator; and
   a leaf spring second pressure member configured to press the other receiving block toward the second heat generator.

8. The electronic device of claim 2, wherein the member is provided outside the area facing the first heat generator.

9. The electronic device of claim 8 further comprising a leaf spring pressure member configured to press the heat receiving block toward the first heat generator, wherein
   the pressure member comprises a plurality of through-hole sections,
   the heat receiving block and the member comprise positioning pins which are provided outside the area facing the first heat generator, and
   the positioning pins fit into the through-hole sections to determine a position of the pressure member.

10. The electronic device of claim 2 further comprising another receiving block interposed between the third portion of the second heat pipe and the second heat generator, wherein
   the other receiving block comprises a plurality of corners, and a fitting portion which extends from one corner to the other corner and into which the third portion of the second heat pipe fits.

11. The electronic device of claim 2 further comprising a sheet-like heat connection member provided in a gap between the second heat pipe and the heat receiving block, and configured to thermally connect the second heat pipe and the heat receiving block.

12. The electronic device of claim 2 further comprising a sheet-like thermal insulation member provided in a gap between the second heat pipe and the heat receiving block, and configured to thermally insulate the second heat pipe and the heat receiving block from each other.

* * * * *